(12) United States Patent
Cho

(10) Patent No.: US 8,008,997 B2
(45) Date of Patent: Aug. 30, 2011

(54) PRINTED CIRCUIT BOARD FILTER HAVING ROWS OF VIAS DEFINING A QUASI CAVITY THAT IS BELOW A CUTOFF FREQUENCY

(75) Inventor: Ching-Fai Cho, La Canada, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 5 days.

(21) Appl. No.: 11/907,048

(22) Filed: Oct. 9, 2007

(65) Prior Publication Data

US 2009/0091402 A1    Apr. 9, 2009

(51) Int. Cl.
*H01P 1/207* (2006.01)
(52) U.S. Cl. ............................. 333/208; 333/248; 333/26
(58) Field of Classification Search .................... 333/26, 333/208, 248
See application file for complete search history.

(56) References Cited

U.S. PATENT DOCUMENTS

| 4,801,905 | A | * | 1/1989 | Becker | 333/238 |
| 5,982,256 | A | * | 11/1999 | Uchimura et al. | 333/239 |
| 6,677,837 | B2 | * | 1/2004 | Kojima et al. | 333/208 |
| 7,132,905 | B2 | * | 11/2006 | Sano | 333/26 |
| 2004/0085151 | A1 | * | 5/2004 | Fukunaga | 333/26 |
| 2004/0183621 | A1 | * | 9/2004 | Lo Hine Tong et al. | 333/26 |
| 2007/0120628 | A1 | * | 5/2007 | Jun et al. | 333/208 |

* cited by examiner

*Primary Examiner* — Benny Lee
(74) *Attorney, Agent, or Firm* — Davidson Berquist Jackson & Gowdey, LLP

(57) ABSTRACT

A low frequency reject filter element is formed on a printed circuit board that utilizes the fact that power transmission in a waveguide is cut-off below a certain frequency. A quasi waveguide cavity is formed in printed circuit board using the top and bottom ground plane of the stripline circuit and using conductive via holes to form the side walls of the cavity. Waveguide cavity mode is launched from the input and output striplines by shorting them to ground. Transformers and matching via hole elements may be used to improve matching. The resulting filter is compact and is highly effective in suppressing low frequency transmissions.

1 Claim, 4 Drawing Sheets

US 8,008,997 B2

PRINTED CIRCUIT BOARD FILTER HAVING ROWS OF VIAS DEFINING A QUASI CAVITY THAT IS BELOW A CUTOFF FREQUENCY

This relates to filters in a stripline transmission line medium and in particular to filters on printed circuit boards in antenna arrays.

INTRODUCTION

Filters in a microwave system are used to suppress unwanted frequencies that may interfere with the functioning of the microwave system. In particular, an antenna designed to operate in a certain frequency band may be placed in an environment where many other antenna systems operating at different frequencies are transmitting powerful signals. This is often the case in a shipboard platform. Some communication antennae may be operating at Ku band while other long range surveillance radars may be operating at L and S band with very high transmit power. In order for this antenna to operate properly, the signals from the other lower frequency antennae received by this antenna must be substantially suppressed.

The distribution of RF signals in many modern microwave systems is through printed circuit boards because of their low design cost and low production cost. Filter elements are often integrated inside the circuit boards. Some of the filter elements used are parallel coupled filters, shunt stub filters, and coupled resonator filters. However, using these elements to design a high performance low frequency band reject filter often results result in a filter that is physically large and is lossy.

Methods and systems in accordance with the present invention provide a better low-reject filter for on printed circuit boards that is relatively compact, low loss, and that rejects all frequencies below a certain cutoff frequency.

SUMMARY

Methods and systems consistent with the present invention provide a printed circuit board comprising a stripline to deliver electromagnetic energy, and a transition region from the stripline to a quasi waveguide transmission line. They also provide a quasi-cavity to filter electromagnetic energy passing through the stripline below a cut-off frequency.

In accordance with another embodiment, a method of manufacturing a printed circuit board filter element is provided comprising forming a conductive stripline on a printed circuit board, and forming a transition from the stripline to a quasi waveguide transmission line. It also comprises forming a quasi-cavity around the stripline on the printed circuit board tuned to filter out electromagnetic energy below a cut-off frequency transmitted by the stripline.

DETAILED DESCRIPTION

Glossary. As used in this description and in the claims, the following terms shall be construed to have the following meanings:

(1) RF frequency bands are referred by their standard nomenclatures, as follows:
  (a) "L-band" means 1-2 GHz;
  (b) "S-band" means 2-4 GHz;
  (e) "Ku-band" means 12-18 GHz;
(2) "antenna" means a structure for radiating or receiving electromagnetic waves;
(3) "low frequency" means frequencies below the operating frequencies of the antenna to be protected;
(4) "cavity" means a metallic enclosure with two openings for RF energies to pass in and out;
(5) "quasi-cavity" means a structure that acts as a cavity without necessarily requiring a contiguously surrounding wall;
(6) "quasi-waveguide" means structure that acts like a waveguide without necessarily requiring a contiguously surrounding wall;
(7) "via-hole" means a hole formed in a printed circuit board and filled with a conductive material; and
(8) "cut-off" frequency means that frequency below which the signal is attenuated by a substantial amount (usually 10 dB or more, but in some applications 3 dB or more).

Figure 1:
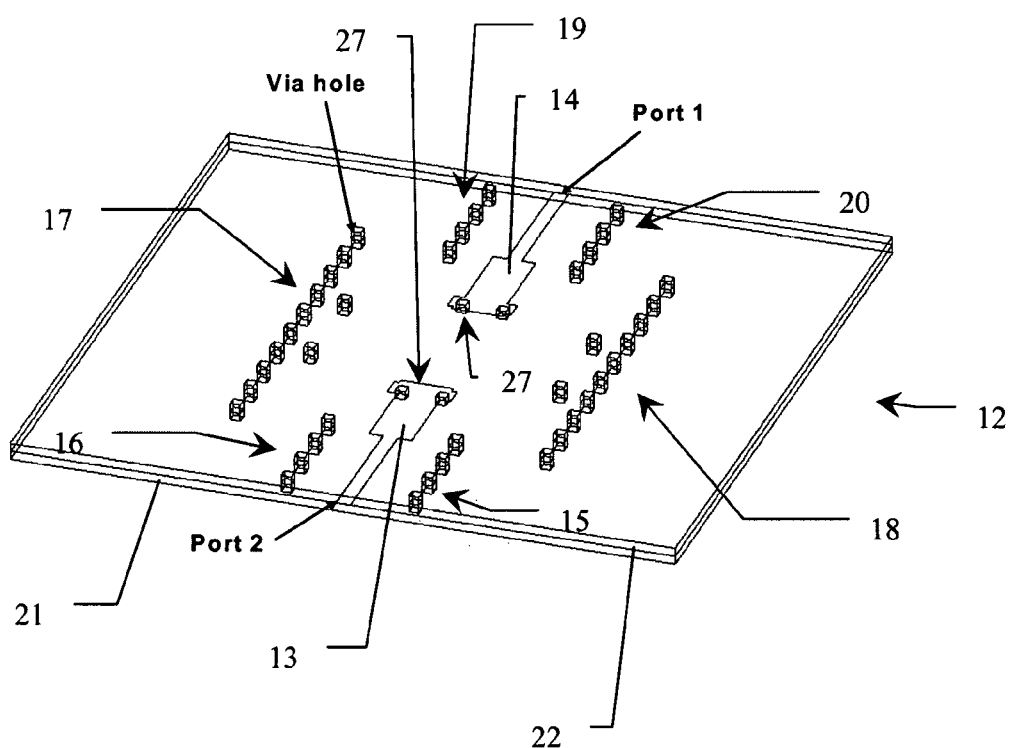
FIG. 1 is a perspective view of an illustrative example compact stripline low frequency band reject filter.
Figure 5:
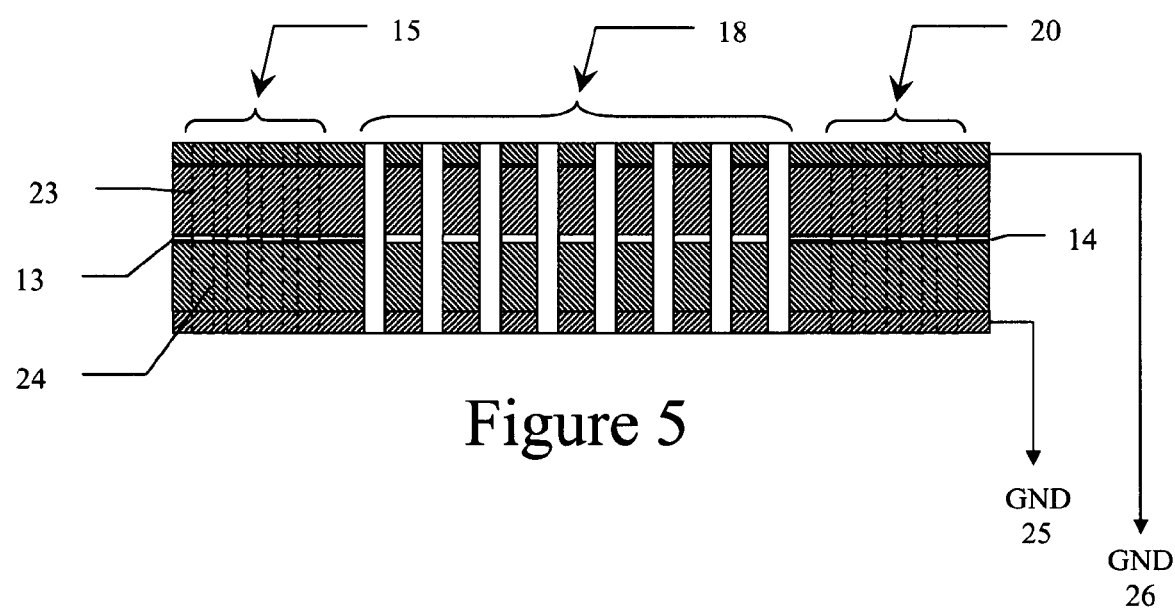
FIG. 5 is a cross-section of the example compact stripline low frequency reject filter circuit board of FIG. 1.

A compact stripline low frequency band reject filter can be formed in a printed circuit board to operate in a manner similar to the way prior waveguide cavities were used to filter out signals below a cut-off frequency of the waveguide. Transmission line tubes, for example, have been developed that include inner cavities forming an aperture having a characteristic frequency cut-off below which no electromagnetic radiation will pass through the cavity. FIG. 1 illustrates a low-cost, low profile method of creating a cavity in a printed circuit board for a compact stripline. The stripline circuit 12 includes striplines 13 and 14, first substrate 21 having a nonconductive portion 24 (FIG. 5) and a bottom ground plane 25 (FIG. 5), and second substrate 22 sandwiching the striplines 13 and 14. Second substrate 22 includes nonconductive portion 23 (FIG. 5) and top ground plane 26 (FIG. 5). A quasi waveguide is formed with the top ground 26 (FIG. 5) and bottom ground 25 (FIG. 5) of the stripline circuit and with the effective "side walls" formed by the via holes 17 and 18 e.g., see FIGS. 1 and 3. Port 1 and Port 2 are the input and output ports of the stripline circuit. Striplines 13 and 14 are transformer sections that change the impedance of the striplines. Via holes 27 short the signal lines to ground, launching a waveguide mode inside the quasi waveguide that couples the signal from Port 1 to Port 2.

Via-holes 15, 16, 19 and 20 on the printed circuit board short the top ground plane 26 to the bottom ground plane 25 to create a quasi-waveguide cavity between the two striplines 13 and 14.

FIG. 5 shows a side sectional view of the example filter element of FIG. 1, taken for example, along a plane intersecting the row of via-holes 18 in FIG. 1. The two striplines 13 and 14 are shown in the sandwich middle of the two nonconductive portions 23 and 24 of the substrates 22 and 21, respectively in FIG. 1. The same reference numerals used on different Figures represent the same components.

Figure 4:
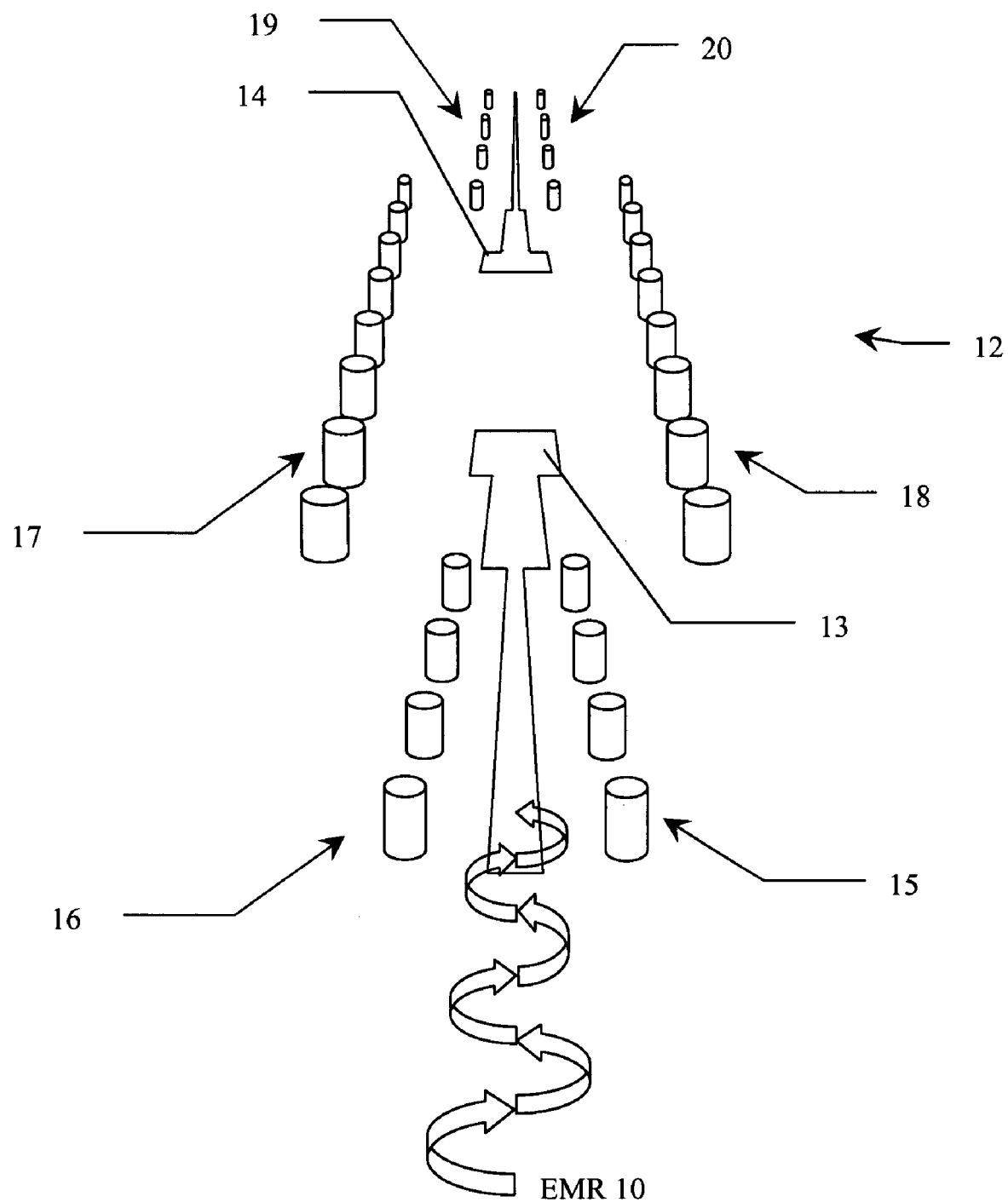
FIG. 4 is a view from the perspective of an 1M wave entering the example compact stripline low frequency reject filter inside the circuit board.

FIG. 4 shows a perspective view of the antenna element, as seen by the incoming electromagnetic guided wave (EMR)

10. Incident signal will include the desired high-frequency signal, and may include interfering low-frequency signals. As the electromagnetic guided wave (EMR) 10 propagates along the stripline 13, it passes through a transformer section to convert it to lower impedance. It is then shorted to the ground with via holes 17 and the stripline guided wave is converted into a waveguide mode inside the quasi-cavity created by the top ground 26 and bottom grounds 25 (shown in FIG. 5) and the via holes 15, 16, 17, 18, 19, 20. RF signals having a frequency below the cut-off frequency of the quasi-cavity and will be rejected.

The via-holes 15, 16, 17, 18, 19, and 20 all short the top ground plane 26 to the bottom ground plane 25 (FIG. 5) to create the quasi-cavity shown in FIG. 4. They are plated holes which may be filled with conductive material to ensure good electrical contact. In its broadest sense, a quasi-cavity in the printed circuit board without regard to how the quasi-cavity is formed. Preferably, the quasi-cavity is formed by some effective number of via-holes spaced to create the quasi-cavity having the desired low-frequency cut-off value.

The size of the quasi-cavity is such that low frequency components of the quasi waveguide modes cannot be excited and are therefore rejected. Methods and systems in accordance with the present invention include all natural extension of the aforementioned ideas by changing the number of via-holes, size of the via-holes, distribution of the via-holes in the cavity, and/or by modifying the transformer sections of the feed lines to change the pass band characteristics of the filter.

Figure 3:
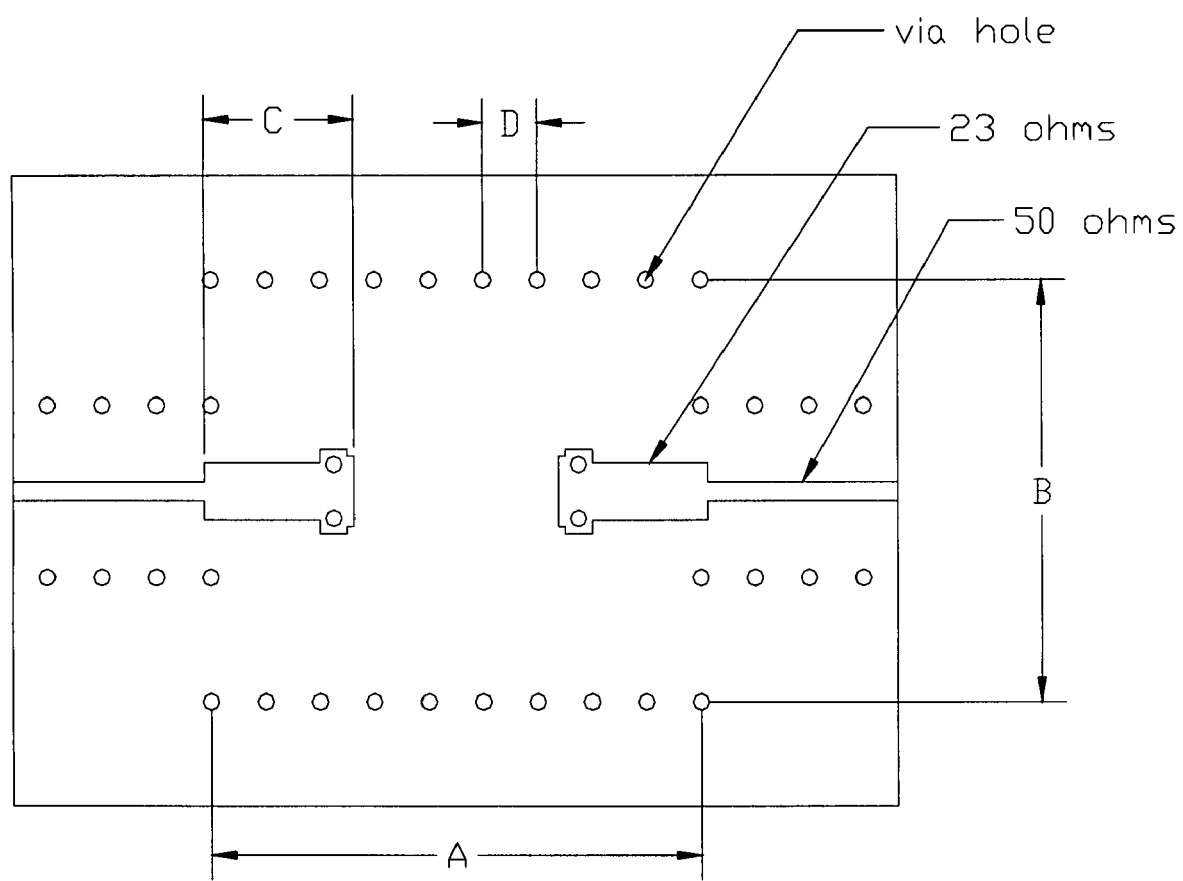
FIG. 3 is a front schematic view of the example compact stripline low frequency band reject filter as in FIG. 1.

To illustrate methods and systems in accordance with the present invention, FIG. 3 shows one example (non-limiting) embodiment of quasi-cavity sizes. On FIG. 3, a via hole is shown that may be, for example, via hole 18 on FIG. 1. In FIG. 3:

A=0.360"
B=0.306"
C=0.110"

H (not shown) is the stripline height of the striplines 13 and 14. H=0.020".

D=0.40"

The middle portion of the striplines 13 and 14 are, as shown, 23 ohms. The narrower portions are, as shown, 50 ohms.

The substrate in FIG. 3 has a dielectric constant of 3 that works below 9 GHz.

Other sizes are contemplated by the inventions described herein. The size of the resultant quasi-cavity will vary as well depending on the frequencies desired to be rejected. In general, the example circuit of FIG. 3 can be scaled such that the low frequency rejection starts at different frequencies. The basic dimensions will be:

A=0.74 $\lambda g$
B=0.63 $\lambda g$
C=0.23 $\lambda g$
D=0.05 $\lambda g$

In the above equations, $\lambda g$ is the wavelength inside the substrate for the desired frequencies and the substrate height is 0.04 $\lambda g$. The maximum frequency for the low frequency rejection band is 0.64 f, where f is the frequency of the beginning of the desired pass band. The rejection band is defined to be the frequency band with −20 dB or more rejection.

An electromagnetic simulation of the performance of a circuit described above is shown in FIG. 2. In it, port 1 is taken at the narrow end of stripline 13 and port 2 is taken at the narrow end of stripline 14 as depicted in FIG. 1. As seen on the Port 1 to Port 2 Coupling line in the simulation of FIG. 2, the quasi-cavity filter passes signals between 14 and 22 GHz, while rejecting by 15 dB or more all signals below 10 GHz. By evidence of simulation, it appears that quasi-cavities on printed circuit boards can reject low frequency signals while passing high frequency ones. The quasi-cavity is also an easily manufactured, non-bulky, and straightforward method of adding low-frequency rejection to a transmission stripline on a printed circuit board, without adding stubs, lumped elements, or surface components. The Port 1 return loss is also shown on FIG. 2.

Figure 2:
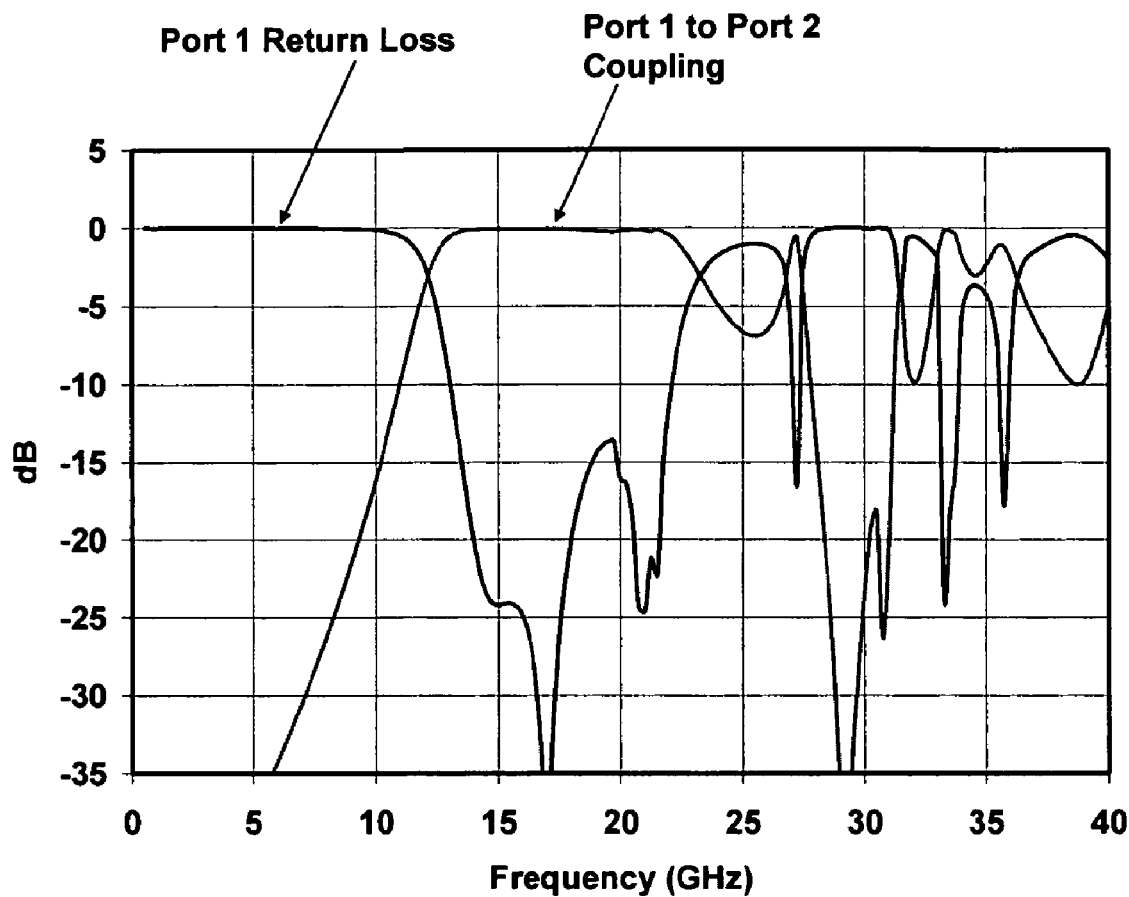
FIG. 2 is an illustrative simulated performance graph of the example compact stripline low frequency band reject filter of FIG. 1 using Ansoft Corporation's High Frequency Structure Simulator software.

The cut-off frequency can be defined in many traditional manners. In the above example, signals are cutoff if rejected at 15 dB. Other applications may suggest an improved cutoff occur at a rejection of 20 dB. As shown in FIG. 2, even rejections at 3 dB can be envisioned to be an advantageous advancement in terms of ease of adding the filter to the printed circuit board versus degree of rejection obtained.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A printed circuit board, comprising:
first and second substrates each defining an outer plane and an inner plane, the first and second substrates arranged together so respective inner planes face one another;
a first ground plane disposed on the outer plane of the first substrate;
a second ground plane disposed on the outer plane of the second substrate;
first and second conductive striplines sandwiched between the inner planes of the first and second substrates, each of the first and second striplines having a respective terminal end, the terminal ends of the first and second strips proximate to but not touching each other;
first and second rows of via holes arranged in a generally longitudinal direction of the striplines, the first row of via holes being arranged on one side of the striplines without touching the striplines and the second row of via holes being arranged on an opposing side of the striplines without touching the striplines, the first row of via holes and the second row of via holes electrically connecting the first ground plane to the second ground plane; whereby the combination of (1) the first ground plane near terminal ends of the first and second conductive striplines, (2) the second ground plane near the terminal ends of the first and second conductive striplines, and (3) the first row of via holes and the second row of via holes define a quasi cavity that prevents the passage of electromagnetic radiation below a cutoff frequency, wherein the printed circuit board is configured to receive an electromagnetic radiation signal of a particular frequency and the via holes of the first row of via holes and the via holes of the second row of via holes are spaced apart about 0.05 times a wavelength of the electromagnetic radiation signal between the first and second substrates at the particular frequency.

* * * * *

UNITED STATES PATENT AND TRADEMARK OFFICE
CERTIFICATE OF CORRECTION

PATENT NO. : 8,008,997 B2
APPLICATION NO. : 11/907048
DATED : August 30, 2011
INVENTOR(S) : Ching-Fai Cho It is certified that error appears in the above-identified patent and that said Letters Patent is hereby corrected as shown below:

In the Specifications:
Col. 1 L. 31 is now correctly shown as follows: "often results in a filter that is physically large and is"

Col. 1 L. 65 is now correctly shown as follows: "Fig. 4 is a view from the perspective of an EM wave"

In the Claims:
Col. 4 LL. 37-40 is now correctly shown as follows: "the inner planes of the first and second substrates, each stripline having a terminal end proximate to but not touching the other stripline;"

Signed and Sealed this
Thirtieth Day of April, 2013

Teresa Stanek Rea
*Acting Director of the United States Patent and Trademark Office*